(12) United States Patent
Shin

(10) Patent No.: US 7,737,746 B2
(45) Date of Patent: Jun. 15, 2010

(54) DLL CIRCUIT AND METHOD OF CONTROLLING THE SAME

(75) Inventor: Dong-Suk Shin, Ichon (KR)

(73) Assignee: Hynix Semiconductor Inc. (KR)

( * ) Notice: Subject to any disclaimer, the term of this patent is extended or adjusted under 35 U.S.C. 154(b) by 16 days.

(21) Appl. No.: 12/170,282

(22) Filed: Jul. 9, 2008

(65) Prior Publication Data

US 2009/0146707 A1 Jun. 11, 2009

(30) Foreign Application Priority Data

Dec. 10, 2007 (KR) .................... 10-2007-0127474

(51) Int. Cl.
*H03L 7/06* (2006.01)

(52) U.S. Cl. ...................... 327/158; 327/149

(58) Field of Classification Search ................. 327/149, 327/158
See application file for complete search history.

(56) References Cited

U.S. PATENT DOCUMENTS

| | | | | |
|---|---|---|---|---|
| 6,069,506 | A * | 5/2000 | Miller et al. | 327/156 |
| 6,316,976 | B1 * | 11/2001 | Miller et al. | 327/156 |
| 6,433,597 | B2 * | 8/2002 | Jung | 327/158 |
| 6,483,359 | B2 | 11/2002 | Lee | |
| 6,628,154 | B2 * | 9/2003 | Fiscus | 327/158 |
| 6,720,807 | B1 * | 4/2004 | Kubo et al. | 327/141 |
| 6,812,760 | B1 * | 11/2004 | Kim et al. | 327/158 |
| 6,822,494 | B2 | 11/2004 | Kim | |
| 6,853,226 | B2 * | 2/2005 | Kwak et al. | 327/159 |
| 6,943,602 | B1 | 9/2005 | Lee | |
| 7,209,422 | B2 * | 4/2007 | Sato et al. | 369/59.12 |
| 7,327,175 | B2 * | 2/2008 | Lee | 327/158 |
| 7,372,311 | B2 | 5/2008 | Kang | |
| 7,532,050 | B2 * | 5/2009 | Haerle et al. | 327/158 |
| 2002/0000856 | A1 * | 1/2002 | Jung | 327/158 |
| 2002/0130691 | A1 * | 9/2002 | Silvestri | 327/158 |
| 2005/0001663 | A1 * | 1/2005 | Lee | 327/158 |
| 2006/0279342 | A1 * | 12/2006 | Blodgett | 327/158 |
| 2007/0152723 | A1 | 7/2007 | Ahn et al. | |
| 2008/0191773 | A1 * | 8/2008 | Oh | 327/276 |

FOREIGN PATENT DOCUMENTS

| | | |
|---|---|---|
| JP | 2005-020686 | 1/2005 |
| JP | 2005184196 | 7/2005 |
| JP | 2006060332 | 3/2006 |
| KR | 1020070007317 | 1/2007 |
| KR | 1020080075414 | 8/2008 |

* cited by examiner

*Primary Examiner*—Lincoln Donovan
*Assistant Examiner*—Adam D Houston
(74) *Attorney, Agent, or Firm*—Baker & McKenzie LLP

(57) ABSTRACT

A delay locked loop (DLL) circuit includes an initial operation setting unit configured to generate an initial operation signal in response to a reference clock signal and an operation start signal; a shift register configured to generate a delay control code in response to the initial operation signal, a phase comparison signal, and an initial setting code; a delay line configured to delay the reference clock signal or a feedback clock signal in response to the initial operation signal and the delay control code, thereby generating a plurality of unit delay clock signals; and an initial delay monitoring unit configured to generate the initial setting code in response to the reference clock signal and the plurality of unit delay clock signals.

24 Claims, 6 Drawing Sheets

DLL CIRCUIT AND METHOD OF CONTROLLING THE SAME

CROSS-REFERENCE TO RELATED PATENT APPLICATION

This application claims the benefit under 35 U.S.C 119(a) of Korean Application No. 10-2007-0127474, filed on Dec. 10, 2007, in the Korean Intellectual Property Office, the disclosure of which is incorporated herein in its entirety by reference as if set forth in full.

BACKGROUND

1. Technical Field

The descriptions herein relate to a delay locked loop (DLL) circuit and a method of controlling the same, and more particularly, to a DLL circuit that generates an internal clock signal whose phase is more advanced than a phase of an external clock signal and a method of controlling the same.

2. Related Art

In general, a conventional DLL circuit is used to generate an internal clock signal whose phase is more advanced than a phase of a reference clock signal obtained by converting an external clock signal by a predetermined time. The DLL circuit is also used to resolve the following problem: If an internal clock signal used in a semiconductor integrated circuit is delayed by a clock buffer and a transmission line, a phase difference is generated between the internal clock signal and an external clock signal, which results in lengthening an output data access time. As a result, in order to increase an effective data output period, the DLL circuit performs a control operation such that a phase of the internal clock signal is more advanced than a phase of the external clock signal by a predetermined time.

Referring to FIG. 1, a conventional DLL circuit includes a clock input buffer 10, a delay line 20, a fine delay unit 30, a clock driver 40, a delay compensating unit 50, a phase comparing unit 60, and a shift register 70.

The clock input buffer 10 buffers an external clock signal "clk_ext" and generates a reference clock signal "clk_ref". The delay line 20 delays the reference clock signal "clk_ref" in response to a delay control code "dlycnt<1:n>" and generates a unit delay clock signal "clk_ud". The fine delay unit 30 fine-delays the unit delay clock signal "clk_ud" and generates a delay clock signal "clk_dly". The clock driver 40 drives the delay clock signal "clk_dly" and generates an output clock signal "clk_out".

The delay compensating unit 50 delays the delay clock signal "clk_dly" by a predetermined time and generates a feedback clock signal "clk_fb". The phase comparing unit 60 compares phases of the reference clock signal "clk_ref" and the feedback clock signal "clk_fb" and generates a phase comparison signal "phcmp". The shift register 70 generates a plurality of bits of digital code signals in response to the phase comparison signal "phcmp", and outputs the plurality of bits of digital code signals as the delay control code "dlycnt<1:n>".

The delay applied to the reference clock signal "clk_ref" by the delay line 20 varies according to a logical value of the delay control code "dlycnt<1:n>". That is, the reference clock signal "clk_ref" is delayed by a predetermined time by the delay line 20, and the predetermined delay time of the reference clock signal "clk_ref" varies according to the logical value of the delay control code "dlycnt<1:n>". The logical value of the delay control code "dlycnt<1:n>" is changed by one bit for each loop period of the DLL circuit. Accordingly, at the time of the initial operation of the DLL circuit, if the phase difference between the reference clock signal "clk_ref" and the feedback clock signal "clk_fb" is large, then the locking time increases, i.e., time that is needed until the delay line 20 has a locked delay value increases.

In recent years, as the operational speed of conventional semiconductor integrated circuit has increased, it has been required for the DLL circuit to have a fast locking time. However, in a conventional DLL circuit, which uses a shift register and a delay line to perform a delay locked operation, there is a technical limitation on how fast the locking time can become. In order to support the high-speed operation of today's semiconductor integrated circuits, a DLL circuit that can drastically decrease the locking time is beneficial.

SUMMARY

A DLL circuit having a fast locking time and a method of controlling the same, is described herein.

According to one aspect, a delay locked loop (DLL) circuit can include an initial delay monitoring unit configured to generate an initial setting code according to a phase difference between a reference clock signal and a feedback clock signal at an operation point of time, a shift register configured to generate a delay control code in response to the initial setting code, and a delay line configured to delay the reference clock signal in response to the delay control code.

According to another aspect, a delay locked loop (DLL) circuit can include an initial operation setting unit configured to generate an initial operation signal in response to a reference clock signal and an operation start signal, a shift register configured to generate a delay control code in response to the initial operation signal, a phase comparison signal, and an initial setting code, a delay line configured to delay the reference clock signal or a feedback clock signal in response to the initial operation signal and the delay control code, thereby generating a plurality of unit delay clocks signals, and an initial delay monitoring unit configured to generate the initial setting code in response to the reference clock signal and the plurality of unit delay clocks signals.

According to still another aspect, a delay locked loop (DLL) circuit can include a delay line configured to delay a feedback clock signal at the time of the initial operation, thereby generating a plurality of unit delay clocks signal, an initial delay monitoring unit configured to compare a phase of each of the plurality of unit delay clock signals and a phase of a reference clock signal, to monitor an initial phase of the feedback clock signal, thereby generating an initial setting code, and a shift register configured to transmit the initial setting code as a delay control code to the delay line at the time of the initial operation, thereby setting a first delay value of the reference clock signal by the delay line.

According to a further aspect, there is provided a method of controlling a delay locked loop (DLL) circuit. The method can include delaying a feedback clock signal, thereby generating a plurality of unit delay clock signals, comparing a phase of each of the plurality of unit delay clock signals and a phase of a reference clock signal, thereby generating an initial setting code, controlling a delay amount of the reference clock signal by a delay line using the initial setting code as delay control code, and generating the delay control code in response to a phase comparison signal, thereby controlling the delay amount of the reference clock signal by the delay line.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
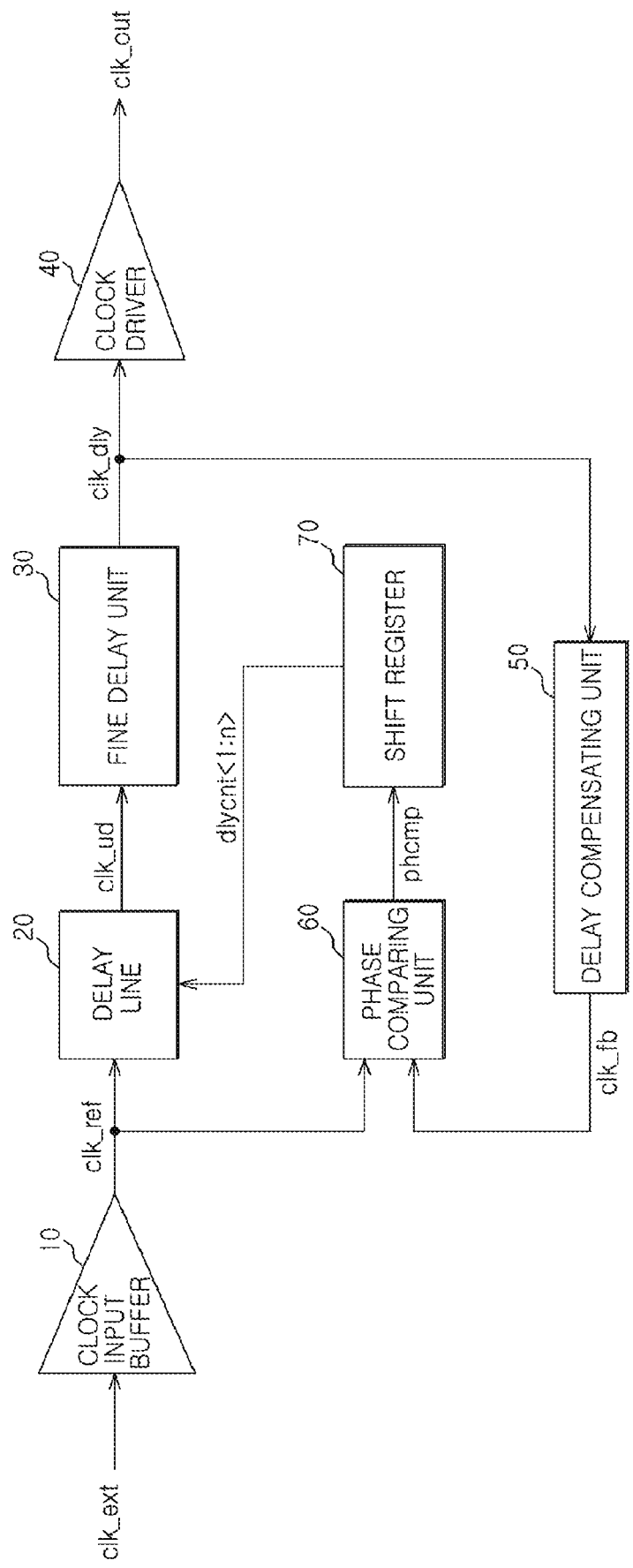
FIG. 1 is a block diagram illustrating the structure of a conventional DLL circuit.
Figure 2:
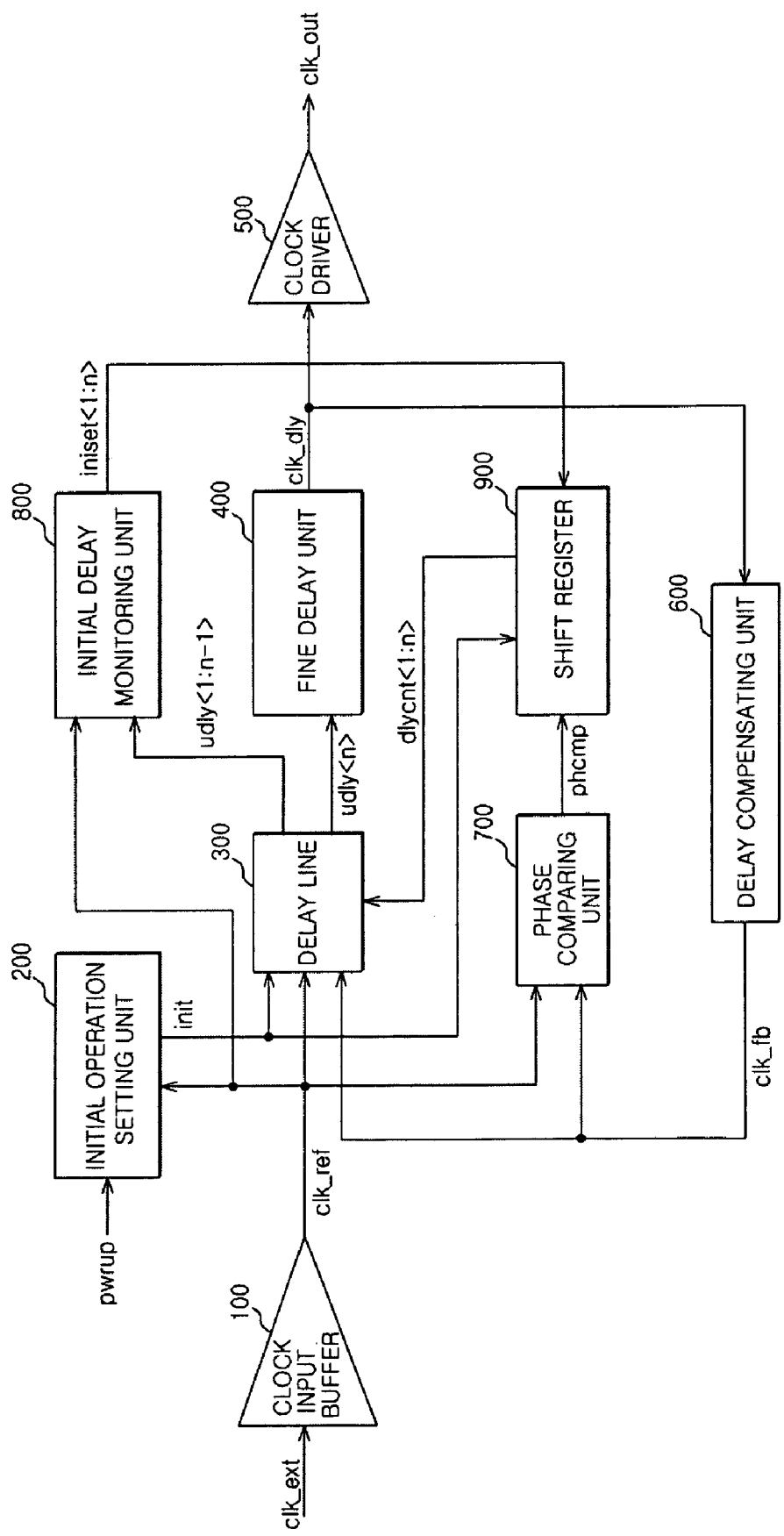
FIG. 2 is a block diagram illustrating a structure of a DLL circuit according to one embodiment.

Referring to FIG. 2, a DLL circuit according to an embodiment can include a clock input buffer 100, an initial operation setting unit 200, a delay line 300, a fine delay unit 400, a clock driver 500, a delay compensating unit 600, a phase comparing unit 700, an initial delay monitoring unit 800, and a shift register 900.

The clock input buffer 100 can perform a buffering operation to change the amplitude of an external clock signal "clk_ext" and generate a reference clock signal "clk_ref". The initial operation setting unit 200 can generate an initial operation signal "nit" in response to the reference clock signal "clk_ref" and a power up signal "pwrup". The delay line 300 can delay the reference clock signal "clk_ref" or a feedback clock signal "clk_fb" in response to the initial operation signal "nit" and a delay control code "dlycnt<1:n>" and generate n unit delay clock signals "udly<1:n>". The fine delay unit 400 can fine-delay an n-th unit delay clock signal "udly<n>" among the n unit delay clock signals "udly<1:n>" and generate a delay clock signal "clk_dly". The clock driver 500 can drive the delay clock signal "clk_dly" and generate an output clock signal "clk_out".

The delay compensating unit 600 can delay the delay clock signal "clk_dly" by a predetermined time and generate the feedback clock signal "clk_fb". The phase comparing unit 700 can compare phases of the reference clock signal "clk_ref" and the feedback clock signal "clk_fb" and generate a phase comparison signal "phcmp". The initial delay monitoring unit 800 can generate an initial setting code "iniset<1:n>" in response to the reference clock signal "clk_ref" and the (n-1) unit delay clock signals "udly<1:n-1>". The shift register 900 can generate a delay control code "dlycnt<1:n>" in response to the initial operation signal "init", the phase comparison signal "phcmp", and the initial setting code "iniset<1:n>".

When the power up signal "pwrup" is enabled, the initial operation setting unit 200 can enable the initial operation signal "init" during a predetermined period of the reference clock signal "clk_ref". An enable period of the initial operation signal "init" needs to be defined as including time needed to generate the feedback clock signal "clk_fb" at the time of the initial operation of the delay compensating unit 600 and time needed when the initial delay monitoring unit 800 generates the initial setting code "iniset<1:n>". Meanwhile, generally, since a semiconductor integrated circuit starts the operation when the power up signal "pwrup" is enabled, it can be understood that the power up signal "pwrup" is an operation start signal that instructs to start the operation of the DLL circuit.

When the initial operation signal "init" is enabled, the delay line 300 can receive and delay the feedback clock signal "clk_fb", and does not perform a delay operation on the reference clock signal "clk_ref". The delay control code "dlycnt<1:n>" that are output by the shift register 900 can be set as a logical value that make it possible when the delay line 300 initially generates the unit delay clock signals "udly<1:n-1>" of (n-1) bits from the feedback clock signal "clk_fb" and the n-th unit delay clock signal "udly<n>" from the reference clock signal "clk_ref". As described above, the n-th unit delay clock signal "udly<n>" is transmitted to the fine delay unit 400, and the fine delay unit 400 fine-delays the n-th unit delay clock signal "udly<n>" and outputs the delay clock signal "clk_dly". Meanwhile, the other unit delay clock signals "udly<1:n-1>" are transmitted to the initial delay monitoring unit 800. The initial delay monitoring unit 800 can compare a phase of each of the (n-1) unit delay clock signals "udly<1:n-1>" and a phase of the reference clock signal "clk_ref", and generate the initial setting code "iniset<1:n>" according to phase information of the reference clock signal "clk_ref" and the feedback clock signal "clk_fb".

If the initial operation signal "init" is enabled and the initial setting code "iniset<1:n>" is input, the shift register 900 outputs the initial setting code "iniset<1:n>" as the delay control code "dlycnt<1:n>". An initial value of the delay control code "dlycnt<1:n>" is set as a logical value to minimize a phase difference between the clock signals according to initial phase information of the reference clock signal "clk_ref" and the feedback clock signal "clk_fb". Accordingly, when the phase difference between the clock signals is initially minimized, the DLL circuit can start the operation, and the locking time of the DLL circuit can be decreased.

Then, when the initial operation signal "init" is disabled, the shift register 900 no longer responds to the initial setting code "iniset<1:n>", and can control the operation of the delay line 300 while changing the predetermined logical value of the delay control code "dlycnt<1:n>" in response to the phase comparison signal "phcmp". The delay line 300 no longer delays the feedback clock signal "clk_fb", but can perform the operation of delaying the reference clock signal "clk_ref" under control of the delay control code "dlycnt<1:n>".

The delay compensating unit 600 can apply a delay value, which can be obtained by simulating the amount of delay by delay elements on a path along which the delay clock signal "clk_dly" is transmitted to a data output buffer, to the delay clock signal "clk_dly", and generate the feedback clock signal "clk_fb". The phase comparing unit 700 can compare the phases of the reference clock signal "clk_ref" and the feedback clock signal "clk_fb" and generate the phase comparison signal "phcmp". The phase comparing unit 700 can be easily implemented by an edge-trigger-typed flip-flop circuit.

As such, during the initial operation period, the DLL circuit according to one embodiment, can extract phase information of the reference clock signal "clk_ref" and the feedback clock signal "clk_fb", such that the delay line 300 applies a delay value to minimize a phase difference between the reference clock signal "clk_ref" and the feedback clock signal "clk_fb" on the basis of the phase information, thereby decreasing time that is needed to perform the delay locked operation.

Figure 3A:
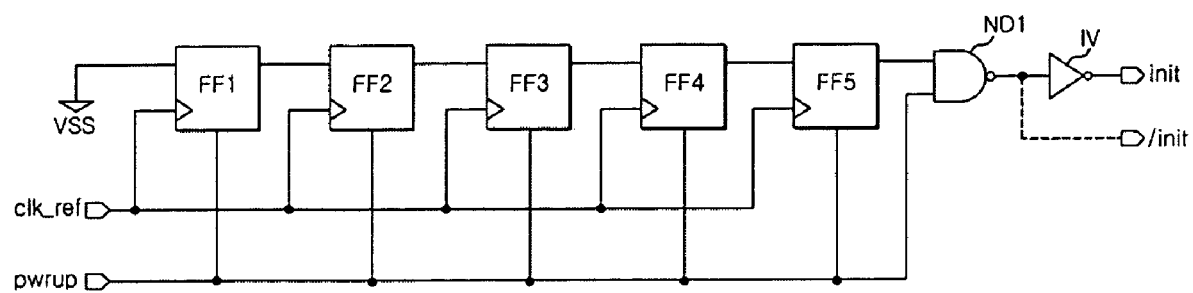
FIG. 3A is a diagram specifically illustrating a structure of an initial operation setting unit that can be included in the circuit illustrated in FIG. 2.

Referring to FIG. 3A, the initial operation setting unit 200 can include first to fifth flip-flops FF1 to FF5, a first NAND gate ND1, and an inverter IV. The first to fifth flip-flops FF1 to FF5 can be connected in series to each other, and can be initialized by the power up signal "pwrup" to output a high-level signal. In response to the reference clock signal "clk_ref", each of the first to fifth flip-flops FF1 to FF5 receives an output signal of a flip-flop at a previous stage and latches the output signal. The first flip-flop FF1 that is located at a first stage can be supplied with a ground voltage VSS. The first NAND gate ND1 can receive an output signal of the fifth flip-flop FF5 and the power up signal "pwrup". The inverter IV can receive an output signal of the first NAND gate "ND1" and output the initial operation signal "init". The initial operation signal "init" may be implemented as a signal pair, and use the output signal from the first NAND gate ND1 as a negative initial operation signal "/init", as shown by a dotted line.

Figure 3B:
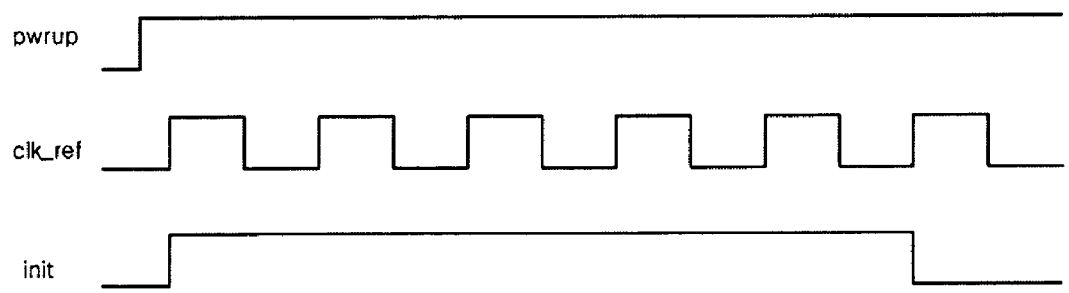
FIG. 3B is a timing chart illustrating the operation of an initial operation setting unit that can be included in the circuit illustrated in FIG. 3A.

If the reference clock signal "clk_ref" is toggled after the power up signal "pwrup" is enabled, the fifth flip-flop FF5 can output a high-level signal, and thus the initial operation signal "init" is enabled at a high level. Since the ground voltage VSS is applied to the first NAND gate ND1 after a fifth rising edge of the reference clock signal "clk_ref", the initial operation signal "init" maintains an enable period during five cycles of the reference clock signal "clk_ref". Waveforms of the power up signal "pwrup", the reference clock signal "clk_ref", and the initial operation signal "init" can be confirmed from FIG. 3B.

In one embodiment described herein, the initial operation signal "init" can be enabled during the five cycles of the reference clock signal "clk_ref", but the disclosures herein are not limited thereto. If the number of flip-flops is increased or decreased according to an installation environment and condition, an enable period of the initial operation signal "init" can be easily changed.

Figure 4:
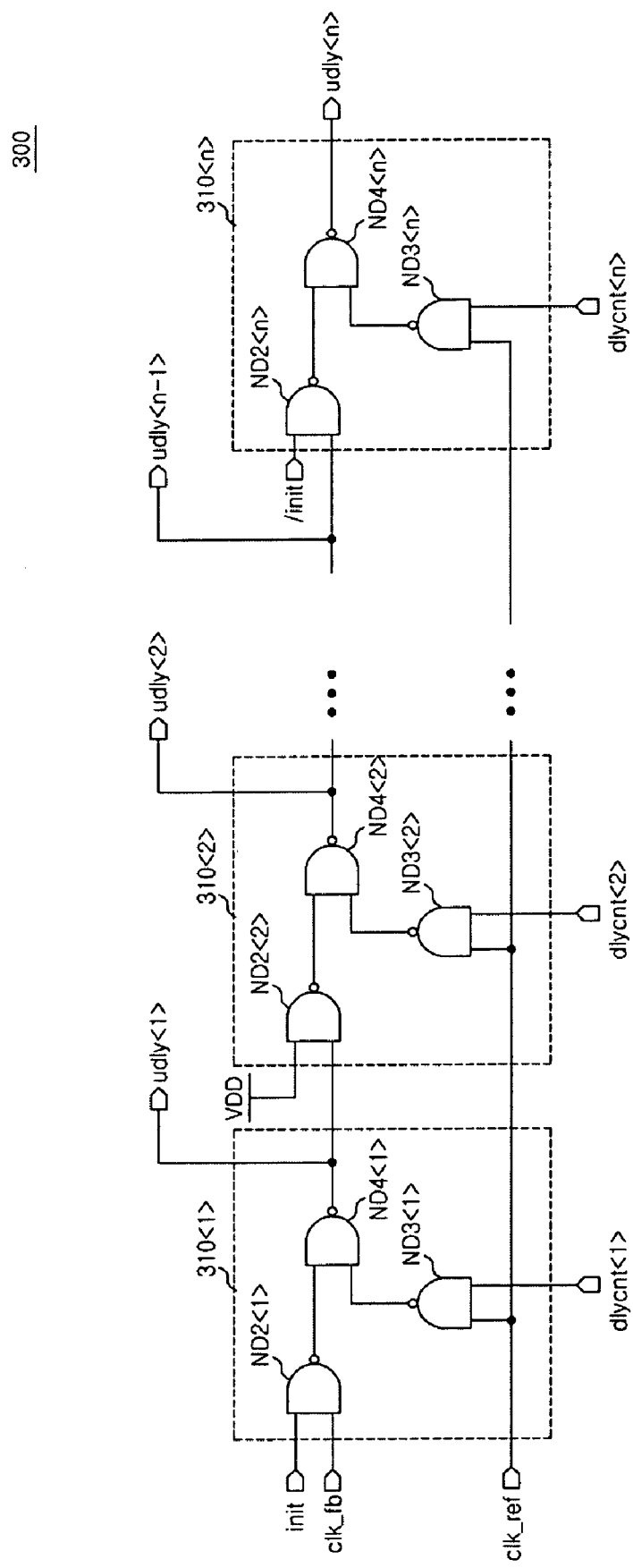
FIG. 4 is a diagram specifically illustrating a structure of a delay line that can be included in the circuit illustrated in FIG. 2.

Referring to FIG. 4, the delay line 300 can include n unit delay sections 310<1:n> that are connected in series to each other. The unit delay sections 310<1:n> can be constructed to output the n unit delay clock signals "udly<1:n>", respectively.

The unit delay sections 310<1:n> can include second to fourth NAND gates "ND2<1:n>" to "ND4<1:n>", respectively. The second NAND gate "ND2<1>" of the unit delay section 310<1>, that is located at the first stage, can receive the initial operation signal "init" and the feedback clock signal "clk_fb". The second NAND gates "ND2<2:n-1>" of the second to (n-1)-th unit delay sections 310<2:n-1> can receive output signals of the unit delay sections 310<1:n-2> located at previous stages and an external power supply voltage VDD. The second NAND gate ND2<n> of the unit delay section 310<n> that is located at the last stage receives the negative initial operation signal "/init" and an output signal of the unit delay section 310<n-1> located at the previous stage.

Each of the n third NAND gates ND3<1:n>, that are respectively included in the unit delay sections 310<1:n>, can receive one bit of the delay control code "dlycnt<1:n>" and the reference clock signal "clk_ref". The n-fourth NAND gates ND4<1:n> can receive output signals of the second NAND gates ND2<1:n> and output signals of the third NAND gates "ND3<1:n>" and output the unit delay clock signals "udly<1:n>", respectively.

In the delay line 300 that has the above-described structure, at the point of time when the initial operation signal "init" is enabled, the delay control code "dlycnt<1:n>" is already set as (0, 0, . . . , 1). The feedback clock signal "clk_fb" can be input to the second NAND gate ND2<1> of the first unit delay section 310<1>, then delayed while passing through the (n-1) unit delay sections 310<1:n-1>, and then output as the (n-1) unit delay clock signals udly<1:n-1>. At this time, the third NAND gate ND3<n> of the n-th unit delay section 310<n> can receive the reference clock signal "clk_ref". Since an output signal of the second NAND gate ND2<n> of the n-th unit delay section 310<n> is at a high level, the n-th unit delay clock signal "udly<n>" can be generated in a form of the delayed reference clock signal "clk_ref".

As such, at the time of an initial operation, the delay line 300 can apply a minimal delay time to the reference clock signal "clk_ref" to generate the n-th unit delay clock signal "udly<n>", and uses the n-th unit delay clock signal "udly<n>" to generate the delay clock signal "clk_dly" and the feedback clock signal "clk_fb". Thus, the feedback clock signal "clk_fb" includes information indicating a unique delay amount of the delay compensating unit 600 in its phase information. If using the feedback clock signal "clk_fb" to generate the (n-1) unit delay clock signals "udly<1:n-1>", the initial delay monitoring unit 800 can extract phase information of the feedback clock signal "clk_fb" using the delay compensating unit 600 at the time of an initial operation and compare the phase information of the feedback clock signal "clk_fb" and the phase information of the reference clock signal "clk_ref". Accordingly, it is possible to know the amount of delay of the reference clock signal "clk_ref" that needs to be delayed by the reference line 300 in order to make the phases of the reference clock signal "clk_ref" and the feedback clock signal "clk_fb" substantially the same. As a result, it is possible to extract a logical value of the initial setting code "iniset<1:n>" that minimizes the phase difference between the reference clock signal clk_ref and the feedback clock signal "clk_fb" by the (n-1) unit delay clock signal "udly<1:n-1>" that are output by the delay line 300.

Then, if the initial operation signal "nit" is disabled, the delay line 300 can delay the reference clock signal "clk_ref" according to the delay control code "dlycnt<1:n>" that have the same logical value as the initial setting code "iniset<1:n>". The delay control code "dlycnt<1:n>" may be changed according to the phases of the reference clock signal "clk_ref" and the feedback clock signal "clk_fb". However, the delay line 300 can complete the delay locked operation in a short time, as compared to the related art.

Figure 5:
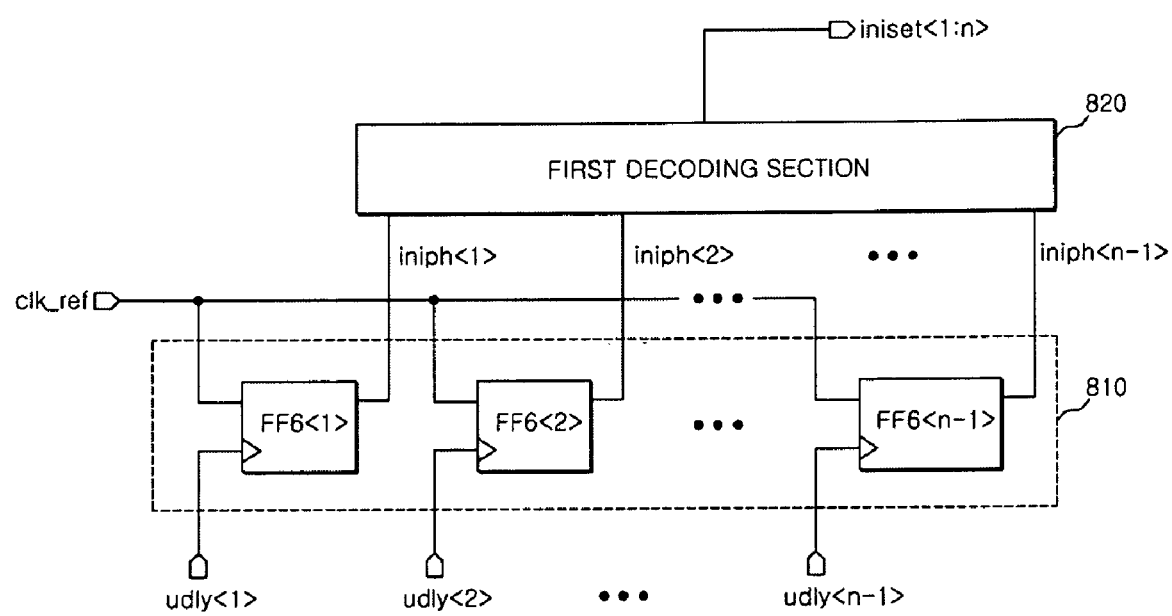
FIG. 5 is a diagram specifically illustrating a structure of an initial delay monitoring unit that can be included in the circuit illustrated in FIG. 2.

Referring to FIG. 5, the initial delay monitoring unit 800 may include an initial phase information extracting section 810 and a first decoding section 820. The initial phase information extracting section 810 can compare the phase of the reference clock signal "clk_ref" and the phase of each of the (n-1) unit delay clock signals "udly<1:n-1>" to generate initial phase code "iniph<1:n-1>". The first decoding section 820 can decode the initial phase code "iniph<1:n-1>" and output the initial setting code "iniset<1:n>".

The initial phase information extracting section 810 can include (n-1) sixth flip-flops FF6<1:n-1> that are connected in series. Each of the sixth flip-flops FF6<1:n-1> can latch the reference clock signal "clk_ref" in response to each of the (n-1) unit delay clock signals "udly<1:n-1>" and output each bit of the initial phase code "iniph<1:n-1>".

In the above-described structure, the initial phase information of the feedback clock signal "clk_fb" and the reference clock signal "clk_ref" can be included in the logical value of the initial phase code "iniph<1:n-1>". Then, the first decoding section 820 can receive the initial phase code "iniph<1:n-1>", and generate initial setting code "iniset<1:n>" that have logical value to minimize the phase difference between the feedback clock signal "clk_fb" and the reference clock signal "clk_ref". The initial setting code "iniset<1:n>" can be implemented such that a bit having a logical value of '1' is only one.

Figure 6:
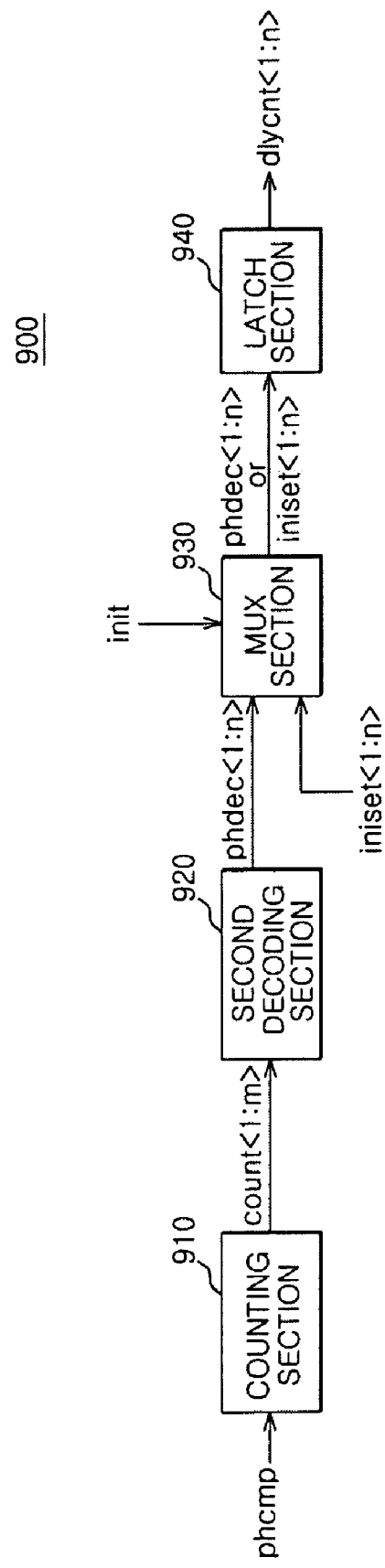
FIG. 6 is a diagram specifically illustrating a structure of a shift register that can be included in the circuit illustrated in FIG. 2.

Referring to FIG. 6, the shift register 900 can include a counting section 910, a second decoding section 920, a MUX section 930, and a latch section 940. The counting section 910 can perform a counting operation in response to the phase comparison signal "phcmp" and output m bits of a count signal "count<1:m>". The second decoding section 920 can decode the m-bits of count signal "count<1:m>" and output a phase decoding code "phdec<1:n>". The MUX section 930 can selectively output the phase decoding code "phdec<1:n>" or the initial setting code "iniset<1:n>" in response to the initial operation signal "init". The latch section 940 can latch an output signal of the MUX section 930 and output the latched signal as the delay control code "dlycnt<1:n>".

The counting section 910 can increase or decrease a logical value of the m-bits of the count signal "count<1:m>" according to the phase information of the reference clock signal "clk_ref" and the feedback clock signal "clk_fb" transmitted through the phase comparison signal "phcmp". Then, the second decoding section 920 can decode the m-bits of the count signal "count<1:m>" and output the phase decoding code "phdec<1:n>". At this time, the phase decoding code "phdec<1:n>" can be implemented such that a bit having a logical value of '1' is only one and the logical value '1' is moved by one digit according to the change in the logical value of the m bits of the count signal "count<1:m>".

If the initial operation signal "init" is enabled, the MUX section 930 can interrupt the phase decoding code "phdec<1:n>" and pass the initial setting code "iniset<1:n>". At this time, in the latch section 940, the logical value of the delay control code "dlycnt<1:n>" is set as (0, 0, . . . , 1). Like this, the structure of the latch section 940 that outputs a specific code when the power up signal "pwrup" is enabled will be easily embodied by those skilled in the art. Then, when the initial setting code "iniset<1:n>" is input, the latch section 940 can latch the initial setting code "iniset<1:n>" and output the latched code as the delay control code "dlycnt<1:n>". That is, during an initial operation period that is defined by the initial operation signal "init", the initial setting code "iniset<1:n>" can be output as the delay control code "dlycnt<1:n>". The delay line 300 can apply, a delay line to minimize the phase difference between the reference clock signal "clk_ref" and the feedback clock signal "clk_fb" in response to the initial setting code "iniset<1:n>" to the reference clock signal "clk_ref".

Then, if the initial operation signal "init" is disabled, the MUX section 930 can interrupt the initial setting code "iniset<1:n>" and pass the phase decoding code "phdec<1:n>". Then, the latch section 940 can latch the phase decoding code "phdec<1:n>" and output the latched code as the delay control code "dlycnt<1:n>". At this time, since the phase difference between the reference clock signal "clk_ref" and the feedback clock signal "clk_fb" is not large, the logical value of the phase decoding code "phdec<1:n>" may be substantially the same as the logical value of the initial setting code "iniset<1:n>". Even when the logical value of the phase decoding code "phdec<1:n>" and the delay control code "dlycnt<1:n>" are changed in response to the phase comparison signal "phcmp", in comparison with conventional art, only a short time is needed until the logical value of the delay control code "dlycnt<1:n>" is locked.

That is, the DLL circuit configured according to the embodiments described herein can determine a unique delay value of the delay compensating unit through the phase of the feedback clock signal at the time of the initial operation, and generate the initial setting code in accordance with the phase information of the feedback clock signal and the reference clock signal. Then, such a DLL circuit can set the first delay time of the reference clock signal by the delay line while using the initial setting code as the delay control code. Accordingly, at the time of the initial operation, the delay line can apply the delay time to the reference clock signal in order to make the phase of the feedback clock signal substantially the same as the phase of the reference clock signal, which results in decreasing the time that is needed until the DLL circuit completes the delay locked operation. As such, the DLL circuit that performs the fast delay locked operation can efficiently support the high-speed operation of the semiconductor integrated circuit.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A delay locked loop (DLL) circuit comprising:
an initial delay monitoring unit configured to generate a plurality of initial setting codes according to phase differences between a reference clock signal and a plurality of feedback clock signals at an operation point of time;
a shift register configured to generate a delay control code in response to the initial setting codes; and
a delay line configured to delay the reference clock signal in response to the delay control code, and to generate the plurality of the delayed feedback clock signals,
wherein the plurality of the delayed feedback clocks include different delaying values, respectively.

2. The DLL circuit of claim 1, wherein the delay line is configured to delay the feedback clock signals and to transmit the delayed feedback clock signals to the initial delay monitoring unit at the operation point of time.

3. A delay locked loop (DLL) circuit comprising:
an initial operation setting unit configured to generate an initial operation signal in response to a reference clock signal and an operation start signal;
a shift register configured to generate a delay control code in response to the initial operation signal, a phase comparison signal, and an initial setting code;
a delay line configured to delay the reference clock signal or a feedback clock signal in response to the initial operation signal and the delay control code, thereby generating a plurality of unit delay clock signals; and
an initial delay monitoring unit configured to generate the initial setting code in response to the reference clock signal and the plurality of unit delay clock signals.

4. The DLL circuit of claim 3, wherein the initial operation setting unit is configured to enable the initial operation signal during a predetermined period of the reference clock signal, when the operation start signal is enabled.

5. The DLL circuit of claim 3, wherein, when the initial operation signal is enabled, the shift register is configured to output the initial setting code as the delay control code, and when the initial operation signal is disabled, the shift register is configured to control a logical value of the delay control code in response to the phase comparison signal.

6. The DLL circuit of claim 5, wherein the shift register comprises:
- a counting section configured to perform a counting operation in response to the phase comparison signal, thereby outputting a plurality of bits of a count signal;
- a decoding section configured to decode the plurality of bits of the count signal, thereby outputting a phase decoding code;
- a MUX section configured to selectively output the phase decoding code or the initial setting code in response to the initial operation signal; and
- a latch section configured to latch an output signal from the MUX section, thereby outputting the latched signal as the delay control code.

7. The DLL circuit of claim 3, wherein, when the initial operation signal is enabled, the delay line is configured to delay the feedback clock signal to generate the plurality of unit delay clock signals and transmit the plurality of unit delay clock signals to the initial delay monitoring unit.

8. The DLL circuit of claim 7, wherein the delay line comprising:
- a plurality of unit delay sections that are connected in series configured to delay the reference clock signal or an output signal of a unit delay section at a previous stage in response to an external power supply voltage and a predetermined one bit of the delay control code, and to output signals generated by delaying the reference clock signal or the output signal of the unit delay section at the previous stage as the plurality of unit delay clock signals;
- a unit delay section at a first stage among the plurality of unit delay sections, configured to delay the reference clock signal or the feedback clock signal in response to the initial operation signal and the predetermined one bit of the delay control code; and
- a unit delay section at a last stage, configured to delay the reference clock signal or an output signal of a unit delay section at a previous stage in response to an inversion signal of the initial operation signal and the predetermined one bit of the delay control code.

9. The DLL circuit of claim 7, wherein the initial delay monitoring unit is configured to compare a phase of each of the plurality of unit delay clock signals and a phase of the reference clock signal to monitor an initial phase of the feedback clock signal, and generate the initial setting code to set a first delay value by the delay line, such that a phase difference between the reference clock signal and the feedback clock signal is minimized.

10. The DLL circuit of claim 9, wherein the initial delay monitoring unit comprises:
- an initial phase information extracting section configured to compare the phase of the reference clock signal and the phase of each of the plurality of unit delay clock signals, thereby generating an initial phase code; and
- a decoding section configured to decode the initial phase code, thereby outputting the initial setting code.

11. The DLL circuit of claim 3, further comprising:
- a clock signal input buffer configured to buffer an external, thereby generating the reference clock signal;
- a fine delay unit configured to fine-delay the last unit delay clock signal output from the delay line, thereby generating a delay clock signal;
- a delay compensating unit configured to delay the delay clock signal by a predetermined time, thereby generating the feedback clock signal; and
- a phase comparing unit configured to compare phases of the reference clock signal and the feedback clock signal, and generate the phase comparison signal.

12. A delay locked loop (DLL) circuit comprising:
- a delay line configured to delay a feedback clock signal at the time of the initial operation, thereby generating a plurality of unit delay clock signals;
- an initial delay monitoring unit configured to compare a phase of each of the plurality of unit delay clock signals and a phase of a reference clock signal, to monitor an initial phase of the feedback clock signal, thereby generating an initial setting code; and
- a shift register configured to transmit the initial setting code as a delay control code to the delay line at the time of the initial operation, thereby setting a first delay value of the reference clock signal by the delay line.

13. The DLL circuit of claim 12, further comprising:
- a fine delay unit configured to fine-delay the last unit delay clock signal output from the delay line, thereby generating a delay clock signal.

14. The DLL circuit of claim 12, wherein the delay line is configured to delay the reference clock signal at the time of the initial operation, thereby generating the last unit delay clock signal among the plurality of unit delay clock signals, and the feedback clock signal is generated by performing a delay operation on the last unit delay clock signal.

15. The DLL circuit of claim 14, wherein the initial operation is defined according to whether an initial operation signal is enabled or not, the delay line comprising:
- a plurality of unit delay units connected in series and configured to delay the reference clock signal or an output signal of a unit delay section at a previous stage in response to an external power supply voltage and a predetermined one bit of the delay control code, and to output signals generated by delaying the reference clock signal or the output signal of the unit delay section at the previous stage as the plurality of unit delay clock signals;
- a unit delay section at a first stage among the plurality of unit delay sections, the unit delay at a first section configured to delay the reference clock signal or the feedback clock signal in response to the initial operation signal and the predetermined one bit of the delay control code; and
- a unit delay section at a last stage configured to delay the reference clock signal or an output signal of a unit delay section at a previous stage in response to an inversion signal of the initial operation signal and the predetermined one bit of the delay control code.

16. The DLL circuit of claim 12, wherein the initial delay monitoring unit comprises:
- an initial phase information extracting section configured to compare the phase of the reference clock signal and the phase of each of the plurality of unit delay clock signals, thereby generating an initial phase code; and
- a decoding section configured to decode the initial phase code, thereby outputting the initial setting code.

17. The DLL circuit of claim 15, wherein the shift register is configured to control a logical value of the delay control code in response to a phase comparison signal when the initial operation signal is disabled.

18. The DLL circuit of claim 17, wherein the shift register comprises:
- a counting section configured to perform a counting operation in response to the phase comparison signal, thereby outputting a plurality of bits of a count signal;

a decoding section configured to decode the plurality of bits of the count signal, thereby outputting a phase decoding code;

a MUX section configured to selectively output the phase decoding code or the initial setting code in response to the initial operation signal; and a latch section configured to latch an output signal from the MUX section, thereby outputting the latched signal as the delay control code.

19. The DLL circuit of claim 15, further comprising:

an initial operation setting unit configured to enable the initial operation signal during a predetermined period of the reference clock signal, when an operation start signal is enabled.

20. The DLL circuit of claim 17, further comprising:

a clock input buffer configured to buffer an external clock signal, thereby generating the reference clock signal;

a delay compensating unit configured to delay the delay clock signal from the delay line by a predetermined time, thereby generating the feedback clock signal; and a phase comparing unit configured to compare the phases of the reference clock signal and the feedback clock signal, and generate the phase comparison signal.

21. A method of controlling a delay locked loop (DLL) circuit, the method comprising:

delaying a feedback clock signal, thereby generating a plurality of unit delay clock signals;

comparing a phase of each of the plurality of unit delay clock signals and a phase of a reference clock signal, thereby generating an initial setting code;

controlling a delay amount of the reference clock signal by a delay line using the initial setting code as delay control code; and generating the delay control code in response to a phase comparison signal, thereby controlling the delay amount of the reference clock signal by the delay line.

22. The method of claim 21, wherein the generating of the initial setting code is comparing the phase of each of the plurality of unit delay clock signals and the phase of the reference clock signal to monitor an initial phase of the feedback clock signal and generating the initial setting code to set a first delay value by the delay line, such that a phase difference between the reference clock signal and the feedback clock signal is minimized.

23. The method of claim 21, wherein the controlling of the delay amount comprises:

performing a counting operation in response to the phase comparison signal, thereby generating a plurality of bits of a count signal;

decoding the plurality of bits of the count signal to generate a phase decoding code; and latching the phase decoding code and outputting the latched code as the delay control code.

24. The method of claim 21, further comprising, before the generating of the plurality of unit delay clock signals:

buffering an external clock signal, thereby generating the reference clock signal;

fine-delaying an output signal of the delay line, thereby generating a delay clock signal;

delaying the delay clock signal by a predetermined time, thereby generating the feedback clock signal; and comparing the phases of the reference clock signal and the feedback clock signal, thereby generating the phase comparison signal.

\* \* \* \* \*